United States Patent
Liu et al.

(10) Patent No.: US 10,465,865 B2
(45) Date of Patent: Nov. 5, 2019

(54) LED LIGHT STRIP

(71) Applicant: GUANGDONG OML TECHNOLOGY CO., LTD, Zhongshan, Guangdong (CN)

(72) Inventors: Huabo Liu, Guangdong (CN); Xiaoping Li, Guangdong (CN)

(73) Assignee: GUANGDONG OML TECHNOLOGY CO., LTD, Zhongshan (CN)

( * ) Notice: Subject to any disclaimer, the term of this patent is extended or adjusted under 35 U.S.C. 154(b) by 0 days.

(21) Appl. No.: 16/108,103

(22) Filed: Aug. 22, 2018

(65) Prior Publication Data

US 2019/0063698 A1     Feb. 28, 2019

(30) Foreign Application Priority Data

Aug. 22, 2017   (CN) .......................... 2017 1 0725219
Aug. 22, 2017   (CN) ..................... 2017 2 1059735 U
Sep. 26, 2017   (CN) ..................... 2017 2 1244900 U
Sep. 26, 2017   (CN) ..................... 2017 2 1244978 U

(51) Int. Cl.
| | |
|---|---|
| F21S 4/24 | (2016.01) |
| F21V 15/01 | (2006.01) |
| H01L 29/866 | (2006.01) |
| H05B 33/08 | (2006.01) |
| F21Y 103/10 | (2016.01) |
| F21Y 115/10 | (2016.01) |

(52) U.S. Cl.
CPC ................ *F21S 4/24* (2016.01); *F21V 15/01* (2013.01); *H01L 29/866* (2013.01); *H05B 33/0806* (2013.01); *H05B 33/0884* (2013.01); *F21Y 2103/10* (2016.08); *F21Y 2115/10* (2016.08); *H01L 2924/12035* (2013.01)

(58) Field of Classification Search
None
See application file for complete search history.

(56) References Cited

U.S. PATENT DOCUMENTS

2012/0165759 A1*   6/2012   Rogers ................. A61B 5/6867
  604/264
2015/0117001 A1*   4/2015   Fan ....................... F21V 23/001
  362/235

* cited by examiner

*Primary Examiner* — Ashok Patel

(57) ABSTRACT

The present invention relates to the field of LED light strip. This invention provides an LED light strip, which includes a flexible protective sleeve and a soft light board, at least one protective circuit being arranged on the soft light board. The soft light board includes in sequence a first insulating soft film, an LED light source and a second insulating soft film. The protective circuit is provided with a zener diode or a voltage stabilizing unit which is connected in parallel with the at least LED light source and which maintains the electrical circuit to be on to keep the soft light board in operation when the LED light source is disconnected. When one or some of the LED light sources is/are damaged, the protective circuit conducts electricity in place of the damaged LED light sources, the LED light strip can continue to be energized and emit light.

4 Claims, 7 Drawing Sheets

A-A

A-A

US 10,465,865 B2

LED LIGHT STRIP

CROSS-REFERENCE TO RELATED APPLICATIONS

The present application claims foreign priority of Chinese Patent Application Nos. 201710725219.1 filed on Aug. 22, 2017, 201721059735.7 filed on Aug. 22, 2017, 201721244900.6 filed on Sep. 26, 2017, and 201721244978.8 filed on Sep. 26, 2017, the entire contents of which are hereby incorporated by reference.

FIELD OF THE INVENTION

The invention relates to the field of LED technology, in particular to an LED light strip.

BACKGROUND OF THE INVENTION

As is well known, the existing LED light strip generally adopts a structure including a flexible protective sleeve, where the flexible protective sleeve is provided with an accommodation chamber extending along the length direction thereof, a soft light board is embedded in the accommodation chamber, and the soft light board is provided with an LED light source that can emit light when energized.

Among them, in order to comprise the main wire layer, the copper strands are omitted in the core wire for the soft light board. The general soft light board is designed to be wide or to be foldable. The wide light board causes the light body to be thick and unfavorable to bend. The foldable soft board is easily short-circuited when the end is cut and thus the light body is not lighted. LEDs require separate packaging, and need to be installed on the soft light board by means of mounting brackets normally or inversely. In addition, the steps of gold wire and reflow soldering are also required. The production process is complicated, with high cost and low efficiency.

The flexible protective cover can protect the soft light board and the LED light source disposed in the accommodation chamber, so that the service life of the LED light strip is greatly enhanced, and a better light output effect can be obtained. Among them, in order to facilitate the light emitted by the LED light source to pass through the flexible protective sleeve, the existing flexible protective sleeve is generally made of a transparent material, and in order to avoid the soft light plate from being easily detached from the accommodation chamber, the dimension of the accommodation chamber is generally the same as or slightly smaller than that of the soft light board. Therefore, the bottom surface of the soft light board inserted into the accommodation chamber will be close to the bottom surface of the inner wall of the accommodation chamber, and when the soft light board is embedded in the accommodation chamber, part of the air in the accommodation chamber cannot be timely discharged and is left between the bottom surface of the soft light board and the bottom surface of the inner wall of the accommodation chamber to form a plurality of fine air bubbles. When the user observes the bottom surface of the LED light strip, a plurality of fine air bubbles are seen, and the LED light source and electrical components on the soft light board can be directly observed, which seriously affects the appearance of the light strip.

In addition, some of the existing LED light strips are provided with a plurality of LED light sources. The LED light sources are all arranged in series on the soft light board of the LED light strip. If one or some of the LED light sources are damaged, the entire LED light source has a broken circuit, the LED light strip fails to be normally energized and emits light, and the entire light strip needs to be repaired or replaced, which is inconvenient for the user.

SUMMARY OF THE INVENTION

The technical problem to be solved by the present invention is to provide an LED light strip of simple structure, which effectively reduces maintenance times and has good durability.

The technical problem to be solved by the present invention is further to prevent people from seeing air bubbles between the bottom surface of the soft light board and the bottom surface of the inner wall of the accommodation chamber.

The technical problem to be solved by the present invention is further to effectively discharge the air between the bottom surface of the soft light board and the bottom surface of the inner wall of the accommodation chamber and to eliminate air bubbles.

In order to solve the above technical problems, the present invention provides an LED light strip, comprising: a flexible protective sleeve, an inside of which being provided with an accommodation chamber extending along a length direction thereof; and a soft light board, the soft light board being embedded in the accommodation chamber; where the soft light board comprises a first insulating soft film, a second insulating soft film and at least one LED light source, the first insulating soft film and the second insulating soft film are respectively attached to both end surfaces of the LED light source, the first insulating soft film or the second insulating soft film is provided with a plurality of circuit layers along a length direction thereof, two adjacent circuit layers are connected end to end by an LED light source, a first light source electrode and a second light source electrode are respectively arranged on two end surfaces of the LED light source, wherein the first light source electrode is electrically connected to a tail of one of the circuit layers through a first electrode, and the second light source electrode is electrically connected to a head of another adjacent circuit layer through a second electrode, the first light source electrode and the first electrode are electrically connected by a first conductive layer, and the second light source electrode and the second electrode are electrically connected by a second conductive layer; and the LED light strip further comprises a protective circuit, the protective circuit being connected in parallel with the at least one LED light source, and when the LED light source is disconnected, the protective circuit is turned on to maintain operation of the soft light board.

As an improvement of the above solution, the protective circuit comprises a zener diode, the zener diode is connected in anti-parallel with the at least one LED light source, and a stable voltage value of the zener diode is greater than a terminal voltage in operation of at least one LED light source connected in parallel with a zener diode.

As an improvement of the above solution, the LED light strip comprises at least two LED light source groups, the LED light source group comprises at least one LED light source, and the protective circuit comprises a voltage stabilizing unit, wherein an A-terminal of the voltage stabilizing unit is respectively connected to a cathode of one LED light source group and an anode of another LED light source group, a B-terminal of the voltage stabilizing unit is connected to an anode of one of the LED light source groups, and a C-terminal is connected to a cathode of another LED light source group.

As an improvement of the above solution, the voltage stabilizing unit comprises a first zener diode and a second zener diode connected in series, a cathode of the first zener diode is connected to an anode connection of one LED light source group, an anode of the second zener diode is connected to a cathode of another LED light source group, and an anode of the first zener diode and a cathode of the second zener diode are connected to each other and are also connected to a cathode of the LED light source group and an anode of another LED light source group.

As an improvement of the above solution, the LED light strip further comprises a current limiting circuit that is connected in series with the LED light source.

As an improvement of the above scheme, the first insulating soft film and the second insulating soft film are both of an elongated structure, and a plurality of circuit layers are provided and spaced at equal distance on the second insulating soft film, two adjacent circuit layers are electrically connected by an LED light source to form LED light strings that are connected in series.

As an improvement of the above solution, the LED light strip further comprises a third insulating soft film disposed on an outside of the second insulating soft film, wherein there are two main wire layers between the second insulating soft film and the third insulating soft film, the two main wire layers are respectively electrically connected to a head and a tail of the LED light string, and the two main wire layers and the second insulating soft film as well as the two main wire layers and the third insulating soft film are fixed by insulative glue.

As an improvement of the above solution, an opening communicated with the accommodation chamber is opened on a bottom of the flexible protective sleeve, and a transparent baffle is provided at the opening that can block the opening.

As an improvement of the above solution, at least one stripe groove extending along a length direction of the flexible protective sleeve is provided on a bottom surface of an inner wall of the accommodation chamber.

Implementation of the present invention may achieve the following beneficial effects.

In the present invention, a soft light board with a unique structure is adopted. The soft light board has compact structure and high flexibility, and is easy to bend and use. Further, the present invention also provides a protective circuit. Therefore, when one or some of the LED light sources on the LED light strip is/are damaged, the protective circuit conducts electricity in place of the damaged LED light sources, so that the LED light strip of the present invention can continue to be energized and emit light, which greatly extends the service life of the LED light strip, making it highly durable.

In addition, in the present invention, an opening communicating with the accommodating chamber is provided at the bottom of the flexible protective cover, and at the same time an opaque baffle capable of blocking the opening is disposed at the opening. Therefore, when the soft light board is embedded in the accommodating chamber, the opaque baffle blocks the soft light board, and the user is prevented from observing the air bubbles between the bottom surface of the soft light board and the bottom surface of the inner wall of the accommodating chamber, by which the appearance of the LED light strip of the present invention becomes more elegant and generous.

In the present invention, since at least one strip groove extending along the length direction of the flexible protective cover is provided at the bottom surface of the inner wall of the accommodating chamber, when the soft light board is embedded in the accommodating chamber, at least one strip groove is disposed between the bottom surface of the soft light board and the bottom surface of the inner wall of the accommodating chamber, so that the air between the bottom surface of the soft light board and the bottom surface of the inner wall of the accommodating chamber can be discharged outside of the accommodating chamber through the stripe groove. In this way, formation of air bubbles is effectively prevented between the bottom surface of the soft light board and the bottom surface of the inner wall of the accommodating chamber, so that the appearance of the LED light strip of the present invention becomes more beautiful and elegant.

DETAILED DESCRIPTION OF ILLUSTRATED EMBODIMENTS

In order to make the objects, technical solutions and advantages of the present invention more apparent, the present invention will be further described in detail with reference to the accompanying drawings. In this regard, the words "upper, lower, left, right, front, back, inner, and outer" regarding orientation that have appeared or will appear in the following are only based on the drawings of the present invention, and the present invention is not limited thereto.

Figure 1:
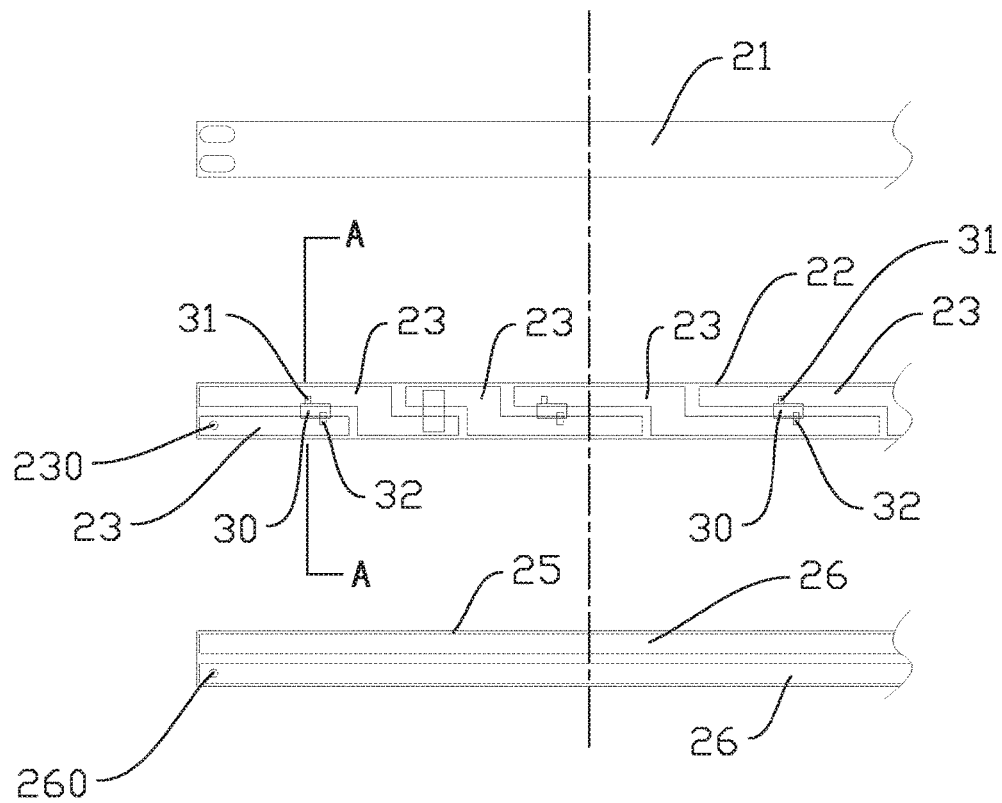
FIG. 1 is a structural exploded view showing the structure of a soft light board of the present invention.
Figure 2:
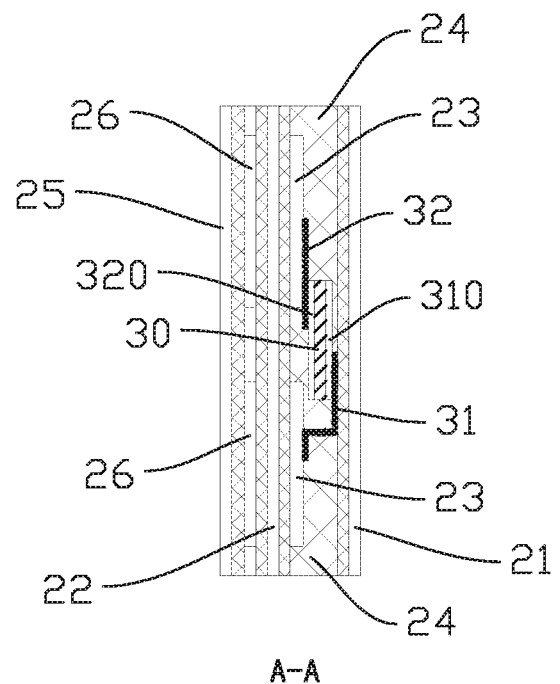
FIG. 2 is a cross-sectional view taken along line A-A of FIG. 1.

As shown in FIG. 1 and FIG. 2, the LED light strip of the present invention includes a flexible protective sleeve and a soft light board, where the flexible protective sleeve has an accommodation chamber extending along the length direction thereof. The soft light board is embedded in the accommodation chamber.

In order to make the manufacture of the LED light strip easier, and to improve the production efficiency of the LED light strip, the soft light board of the present invention comprises a first insulating soft film 21, a second insulating soft film 22 and an LED light source 30. The first insulating soft film 21, and the second insulating soft film 22 are respectively attached to both end faces of the LED light source 30. The surface of the first insulating film 21 or the second insulating film 22 is provided with a plurality of circuit layers 23 which are arranged independently of each other along the length direction thereof. Two adjacent circuit layers 23 are connected by an LED light source 30, and a first chip electrode and a second chip electrode are respectively disposed on both end faces of the LED light source 30. The first chip electrode is electrically connected to one circuit layer 23 of the adjacent two circuit layers 23 through an electrode pin 31, and the second chip electrode is electrically connected to the other circuit layer 23 of the adjacent two circuit layers 23 through a second electrode pin 32. The electrical connection of the circuit layer 23 is electrically connected between the first chip electrode and the first electrode pin 31 are connected through the first conductive layer 310, and the second chip electrode and the second electrode pin 32 are electrically connected through the second conductive layers 320. The first conductive layer 310 and the first chip electrode and the first electrode pin 31 are respectively electrically connected by conductive adhesive, and the second conductive layer 320 and the second chip electrode and the second electrode pin 32 are respectively electrically connected also by conductive adhesive.

As the soft light board 20 of the present invention adopts the above-described structure, the soft light board 20 is made compact in structure, high in flexibility, and convenient for bending.

Figure 3:
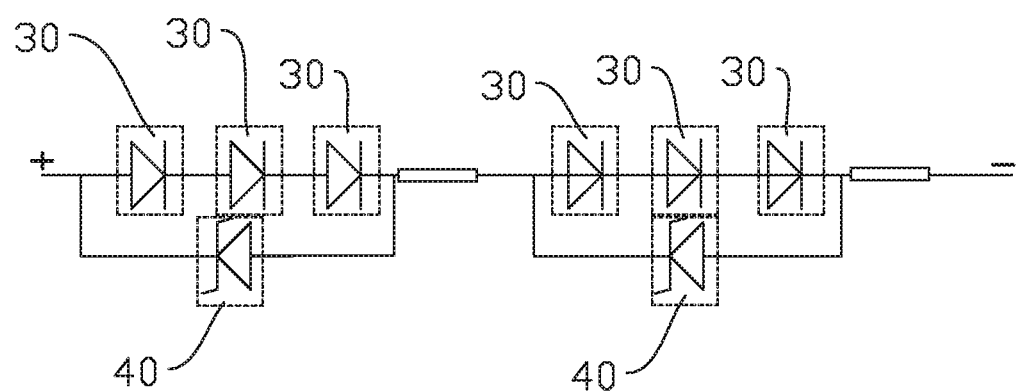
FIG. 3 is a schematic view showing the circuit structure of an embodiment of a soft light board according to the present invention.
Figure 4:
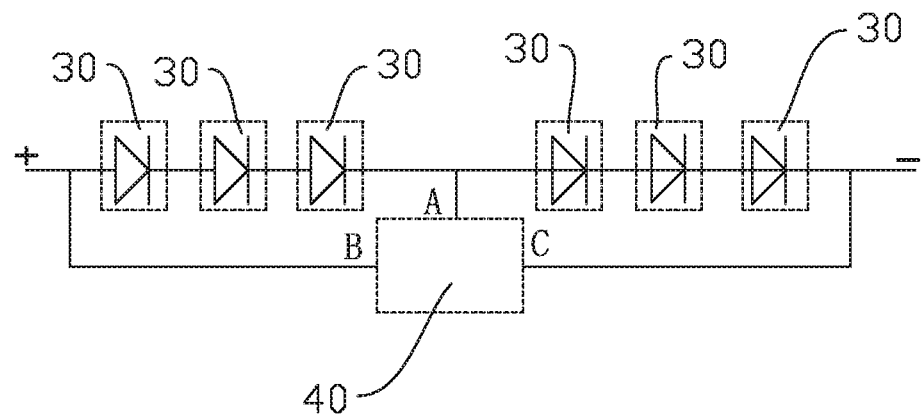
FIG. 4 is a schematic view showing the circuit structure of another embodiment of a soft light board of the present invention.
Figure 5:
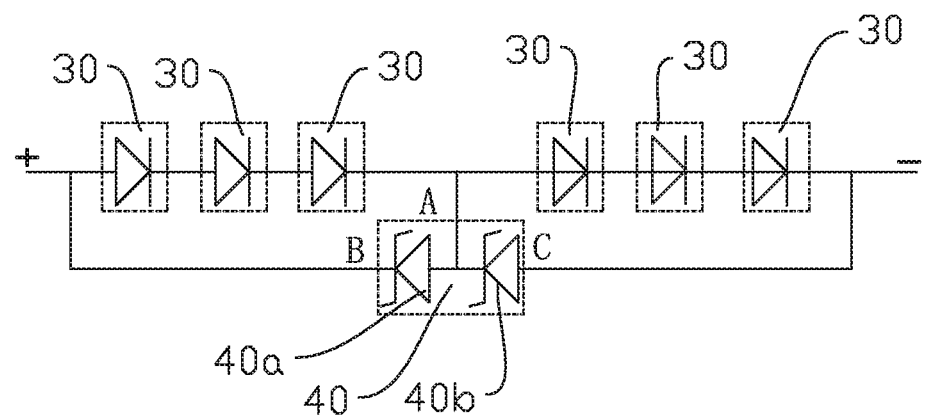
FIG. 5 is a schematic view showing the circuit structure of still another embodiment of a soft light board of the present invention.

As shown in FIG. 3 to FIG. 5, the present invention further includes a protection circuit 40, which is connected in parallel with at least one LED light source 30. When the LED light source 30 is disconnected, the protection circuit 40 is turned on to keep the soft light board in operation. That is, when one or some of the LED light sources 30 on the LED light strip is/are damaged, the protective circuit 40 conducts electricity in place of the damaged LED light sources, so that the LED light strip of the present invention can continue to be energized and emit light, which greatly extends the service life of the LED light strip, making it highly durable.

An embodiment of the protection circuit 40 is shown in FIG. 3, which includes at least one Zener diode that is connected in anti-parallel with at least one LED light source 30. The Zener diode has a stable voltage greater than the voltage across the at least one LED light source 30 in operation that is in parallel connection with the Zener diode. There are two Zener diodes in FIG. 3, as the length of the lamp increases, there can be more Zener diodes. Each Zener diode is successively connected in anti-parallel with three LED light sources 30. The stable voltage value of the Zener diode is Ud. The voltage across each of the three LED light sources 30 is Ua, and the stable voltage value Ud of the Zener diode is slightly larger than Ua. Since Ua is smaller than Ud, the Zener diode is in a non-conducting state. When any of the LED light sources 30 is damaged, the circuit in parallel with the Zener diode is in an open state. At the instant of opening, the voltage across the Zener diode is equal to the power supply voltage since the power supply voltage is larger than the stable voltage Ud of the Zener diode. Therefore, the Zener diode is broken down inversely and turned on. The Zener diode and the remaining LED light sources 30 are connected in series to form a loop, and the remaining LED light sources 30 can continue to be used, which reduces maintenance times and enhances its durability.

Another embodiment of the protection circuit 40 is shown in FIG. 4, which includes at least two LED light source groups, and the LED light source group is composed of at least one LED light source 30. The protection circuit 40 includes a voltage stabilization unit. An A terminal of the voltage stabilization unit is respectively connected to a cathode of one LED light source group and an anode of another LED light source group, and a B terminal of the voltage stabilization unit is respectively connected to an anode of one LED light source group and a C terminal of the voltage stabilization unit is connected to a cathode of another LED light source group. When any LED light source group is disconnected, the voltage stabilization unit is turned on, so that the entire circuit continues to operate.

Yet another embodiment of the protection circuit 40 is shown in FIG. 5, the voltage stabilization unit includes a first Zener diode 40a and a second Zener diode 40b connected in series with each other. A cathode of the first Zener diode 40a (i.e., the B terminal of the voltage stabilizing unit) is connected to an anode of one LED light source group, and an anode of the second Zener diode 40b (i.e., the C terminal of the voltage stabilizing unit) is connected to a cathode of another LED light source group. An anode of the first Zener diode 40a is connected to a cathode of the second Zener diode 40b (to form the A terminal of the voltage stabilizing unit) and simultaneously connected to a cathode of one LED light source group and an anode of the other LED light source group.

In addition, the present invention also includes a current limiting circuit (see FIG. 3). The current limiting circuit is connected in series with the LED light source 30. Here, the current limiting circuit is a current limiting resistor, and the current limiting resistor can reduce the current flowing through the LED light source 30 to ensure safe and stable operation of the LED light source 30.

In order to make the manufacture of the soft light board 20 of the present invention more simple and convenient, here, preferably, the first conductive layer 310 and the first insulating soft film 21 are both made of a transparent or translucent material, and the two conductive layers 320 and the second insulating soft film 22 are both also made of a transparent or translucent material. The first conductive layer 310 is made of a heat conductive material to transfer the heat generated by the LED light source 30 to the first insulating soft film 21 or the outside.

Preferably, the first conductive layer 310 and the second conductive layer 320 are both made of graphene or ITO. In this embodiment, the second conductive layer 320 and the first conductive layer 310 are both graphene, and the graphene may be a single-layered graphene or a multi-layered graphene. The conductive layer made of graphene has a high electrical conductivity and can serve as a conductive path. At the same time, the graphene layer has a light transmittance of up to 97.7%, which enables light to be efficiently emitted and improves light extraction efficiency. The optical adhesive 24 for packaging the LED light source 30 is filled between the first insulating soft film 21 and the second insulating soft film 22, and the optical adhesive 24 is of high transmittance, which helps to improve the light extraction efficiency of the LED light source 30. The optical adhesive 24 and the first insulating soft film 21 as well as the optical adhesive 24 and the second insulating soft film 22 are connected by insulating adhesive.

The first insulating soft film 21 and the second insulating soft film 22 are both elongated structures, and a plurality of circuit layers 23 are equidistantly arranged on the second insulating soft film 22. Two adjacent circuit layers 23 are electrically connected via an LED light source 30 such that the LED light sources 30 form LED light strings in series.

The soft light board 20 of the present invention further includes a third insulating soft film 25 disposed outside the second insulating soft film 22, and two main wire layers 26 between the second insulating soft film 22 and the third insulating soft film 25. The two main conductor layers 26 are respectively electrically connected to two ends of the LED string. The two main conductor layers 26 and the second insulating film 22 as well as the two main conductor layers 26 and the third insulating film 25. are fixed by insulating glue.

In this embodiment, a first through hole 230 for conducting electricity is respectively disposed on the circuit layer 23 at both ends of the LED light string, and the two main wire layers 26 are provided with a second through hole 260 opposite to the first through hole 230. The first through hole 230 and the second through hole 260 are electrically connected by solder.

Figure 6:
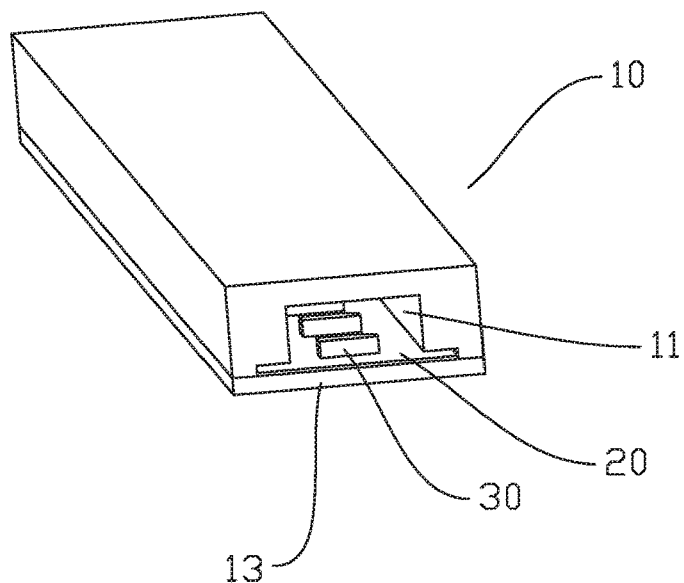
FIG. 6 is a schematic structural view of a first embodiment of an LED light strip of the present invention.
Figure 7:
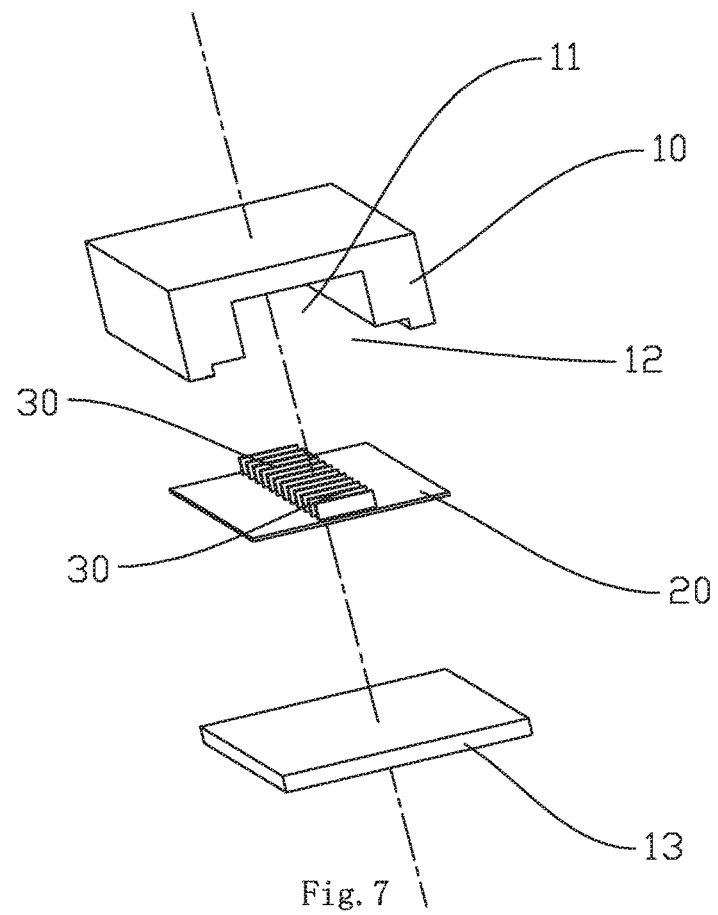
FIG. 7 is a Structural decomposition diagram view showing the structure of the first embodiment of the LED light strip of the present invention.
Figure 8:
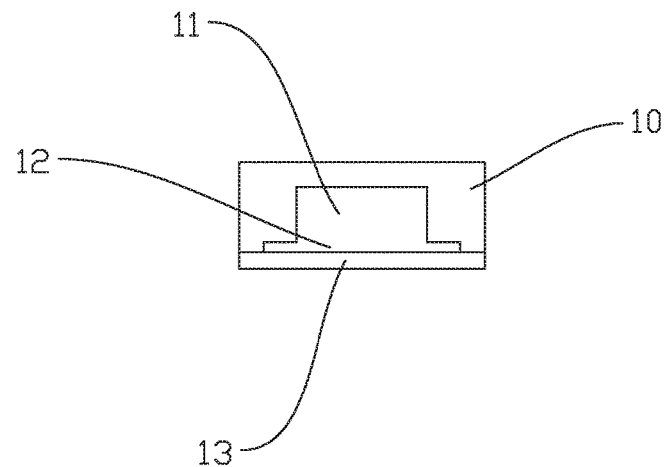
FIG. 8 is a side view of the flexible protective sleeve of FIG. 6.
Figure 9:
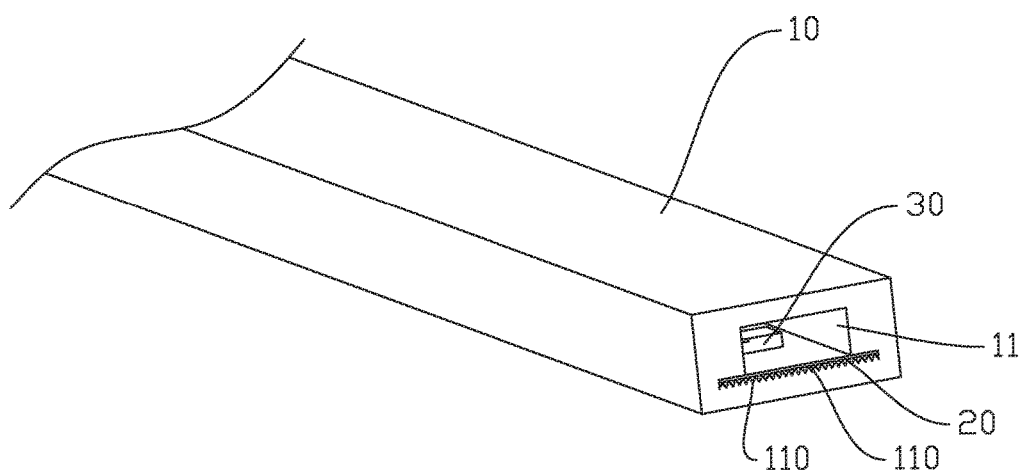
FIG. 9 is a schematic structural view of a second embodiment of the LED light strip of the present invention.
Figure 10:
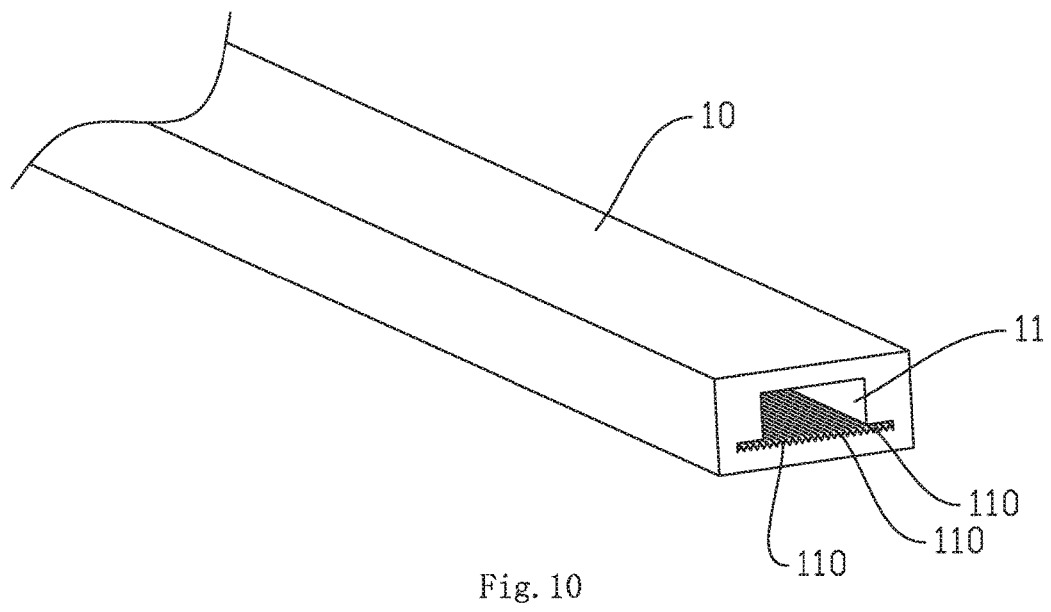
FIG. 10 is a partial view of the flexible protective sleeve of FIG. 9.
Figure 11:
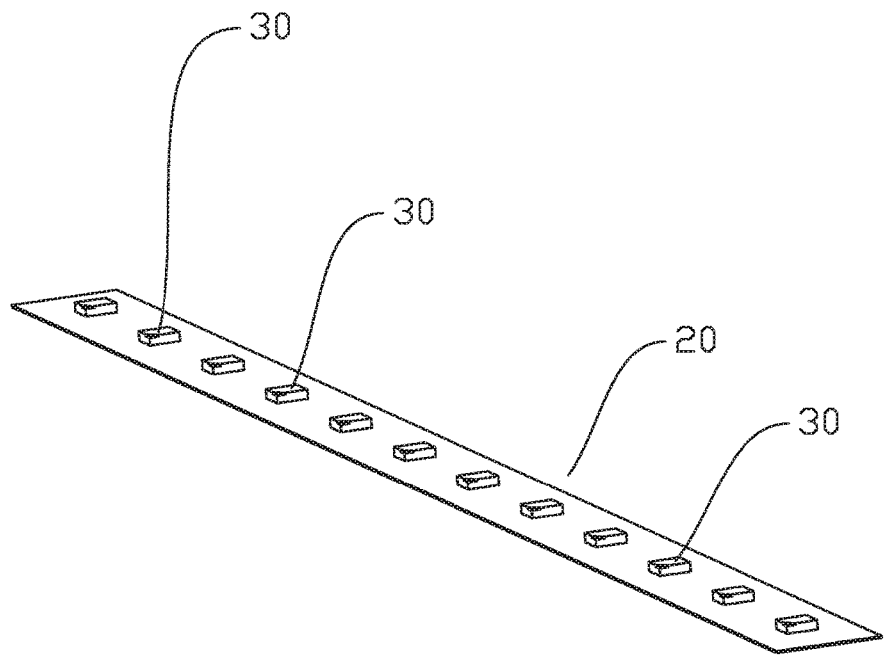
FIG. 11 is a partial view of the soft light board of FIG. 9.
Figure 12:
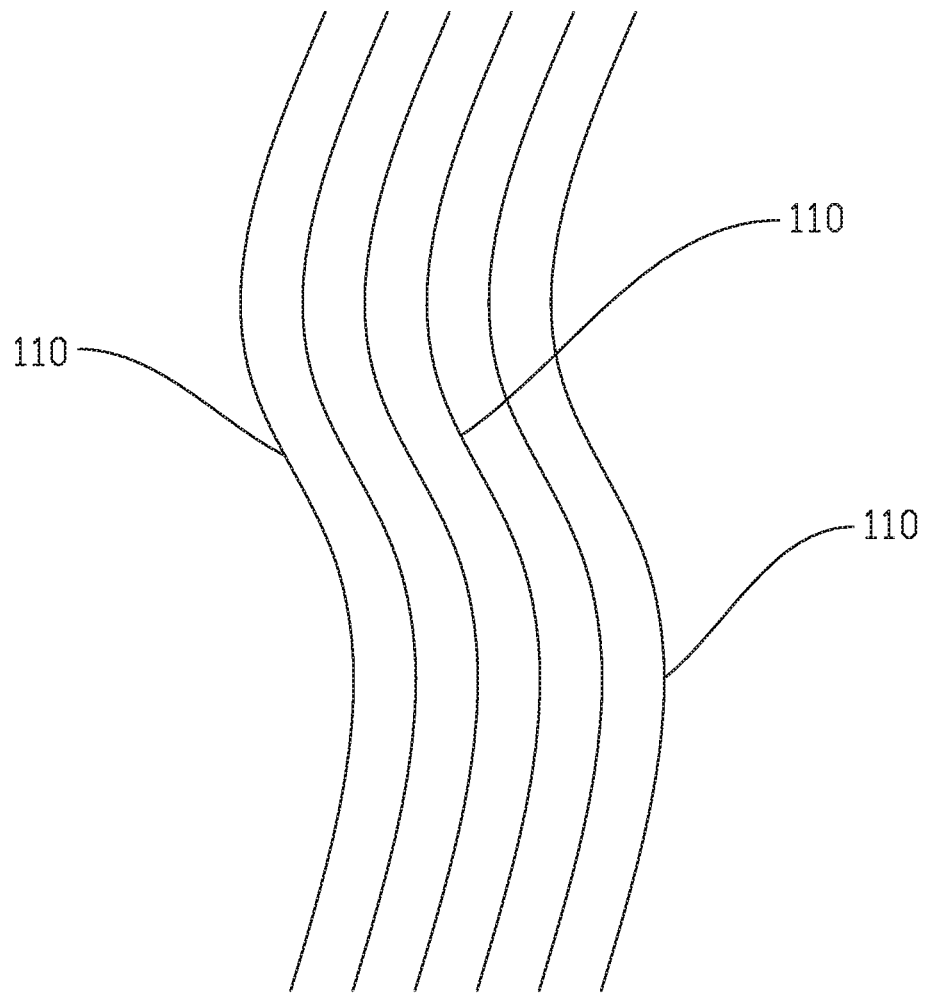
FIG. 12 is a schematic view showing the shape of the stripe groove of FIG. 9.

As shown in FIG. 6 to FIG. 8, the LED light strip of the present embodiment includes a flexible protective sleeve 10. The inside of the flexible protective sleeve 10 defines an accommodation chamber 11 extending along a length direction thereof. A soft light board 20 is disposed in the cavity 11, the soft light board 20 is provided with a plurality of LED light sources 30, and a plurality of LED light sources 30 are disposed in series on the soft light board 20. An opening 12 communicating with the accommodating chamber 11 is defined in the bottom portion of the flexible protective sleeve 10, and an opaque baffle 13 capable of blocking the opening 12 is disposed at the opening 12.

In order to facilitate the production and processing of the flexible protective sleeve 10, it is further preferred that the flexible protective sleeve 10 is a transparent silicone sleeve, and the baffle 13 is a frosted silica gel plate. Therefore, the flexible protective sleeve 10 and the baffle 13 can be integrally processed by extrusion molding, and then the baffle 13 is subjected to a sanding treatment so that the baffle 13 becomes opaque.

Of course, in addition to the sanding treatment of the baffle 13 to make it opaque, other structures may be employed. For example, the flexible protective cover 10 is a transparent silicone sleeve, and the baffle 13 is a colored plate. Specifically, the baffle 13 is a white plate, a black plate, a red plate, a yellow plate, a green plate, a purple plate, an orange plate or a blue plate. Alternatively, the baffle 13 is a colored plate having two or more colors.

In the present invention, an opening 12 communicating with the accommodating chamber 11 is provided at the bottom of the flexible protective cover 10, and at the same time an opaque baffle 13 capable of blocking the opening 12 is disposed at the opening 12. Therefore, when the soft light board 20 is embedded in the accommodating chamber 11, the opaque baffle 13 blocks the soft light board 20, and the user is prevented from observing the air bubbles between the bottom surface of the soft light board 20 and the bottom surface of the inner wall of the accommodating chamber 11, by which the appearance of the LED light strip of the present invention becomes more elegant and generous.

Further, in order to facilitate the production and processing of the LED light strip of the present invention, in the present invention, preferably, the flexible protective cover 10 and the baffle 13 are of a unitary structure. That is, the flexible protective cover 10 and the baffle 13 can be fabricated by integral injection molding, or the flexible protective cover 10 and the baffle 13 can be fabricated by extrusion molding.

Of course, the flexible protective sleeve 10 and the baffle 13 can also be disposed as two independent components. At this time, the baffle 13 is detachably mounted at the opening 12 of the accommodating chamber 11. In order to allow the baffle 13 to be more conveniently mounted at the opening 12 of the accommodating chamber 11, the baffle 13 is preferably attached to the opening 12 of the accommodating chamber 11 by glue. In addition to being attached to the opening 12 of the accommodating chamber 11 by glue, the baffle 13 can be wrapped in the opening 12 of the accommodating chamber 11 by scotch tape according to actual needs.

Correspondingly, for better fixation of the soft light board 20 in the accommodating chamber 11, here, as a preferred embodiment of the present invention, the accommodating chamber 11 has a "convex" shape in cross section. The soft light board 20 is embedded in a lower portion of the accommodating chamber 11, and the LED light source 30 is embedded in an upper portion of the accommodating chamber 11. By arranging the cross-section of the accommodating chamber 11 to be in a "convex" shape, the soft light board 20 and the LED light source 30 can be better clamped to prevent the soft light board 20 from being shaken relative to the flexible protective cover 10.

As shown in FIG. 9 to FIG. 12, the LED light strip of the present embodiment includes a flexible protective sleeve 10, and the inside of the flexible protective sleeve 10 is provided with an accommodation chamber 11 in which a soft light is embedded. A plurality of LED light sources 30 is disposed in series on the soft light board 20. In the present invention, at least the bottom surface of the inner wall of the receiving chamber 11 is opened with at least one stripe groove 110 extending along a length direction of the flexible protective cover 10.

In order to facilitate the light emitted by the LED light source 30 to better pass through the flexible protective sleeve 10 while facilitating the production and manufacture of the flexible protective sleeve 10, here, preferably, the flexible protective sleeve 10 is a transparent protective sleeve.

Since the present invention has at least one strip groove 110 extending along the length direction of the flexible protective cover 10 at the bottom surface of the inner wall of the accommodating chamber 11, when the soft light board 20 is embedded in the accommodating chamber 11, at least one strip groove 110 is disposed between the bottom surface of the soft light board 20 and the bottom surface of the inner wall of the accommodating chamber 11, so that the air between the bottom surface of the soft light board 20 and the bottom surface of the inner wall of the accommodating chamber 11 can be discharged outside of the accommodating chamber 11 through the stripe groove 110. In this way, formation of air bubbles is effectively prevented between the bottom surface of the soft light board 20 and the bottom surface of the inner wall of the accommodating chamber 11, so that the appearance of the LED light strip of the present invention becomes more beautiful and elegant.

Therefore, in order to allow the air between the bottom surface of the soft light board 20 and the bottom surface of the inner wall of the accommodating chamber 11 to be better discharged, in the present invention, preferably, the bottom surface of the inner wall of the accommodating chamber 11 is opened with a plurality of stripe grooves 110 uniformly disposed along the bottom of the inner wall of the accommodating chamber 11. Further preferably, the stripe grooves 110 are straight stripe grooves, and the plurality of straight stripe grooves are arranged in parallel along the longitudinal direction of the flexible protective sleeve 10. In the present invention, a plurality of stripe grooves arranged in parallel at the bottom surface of the inner wall of the accommodating chamber 11 are provided, thereby making the bottom surface of the LED light strip of the present invention to take the form of stripes, thereby making the appearance of the present invention more attractive. Of course, in addition to being arranged as straight stripe grooves, the stripe grooves 110 may be provided in other shapes, such as an S-shape (see FIG. 11). By setting the stripe grooves 110 to an S shape, the bottom surface of the LED light strip of the present invention takes the form of multiple parallel S-shaped stripes, and the appearance becomes more beautiful and generous. There is no bubble, which satisfies the needs of different users.

In the present invention, in order to facilitate the production of the flexible protective sleeve 10, here, preferably, the stripe groove 110 has a V-shaped cross-sectional shape. Of course, the cross-sectional shape of the strip groove 110 may also have other shapes, for example, the stripe groove 110 has a U-shaped cross-sectional shape.

Meanwhile, for better illumination effect of the LED light strip of the present invention, in the present invention, preferably, the soft light board 20 is provided with a plurality of LED light sources 30 evenly arranged along the length direction of the soft light board 20.

The present invention has been described with respect to its preferred embodiments, and it should be noted that those skilled in the art can also make modifications and variations without departing from the principles of the present invention, which modifications and variations are encompassed within the protection scope of the present invention.

What is claimed is:

1. An LED light strip comprising:
    a flexible protective sleeve, an inside of which being provided with an accommodation chamber extending along a length direction thereof; and
    a soft light board, the soft light board being embedded in the accommodation chamber;
    characterized in that
    the soft light board comprises a first insulating soft film, a second insulating soft film and at least one LED light source, the first insulating soft film and the second insulating soft film are respectively attached to both end surfaces of the LED light source, the first insulating soft film or the second insulating soft film is provided with a plurality of circuit layers along a length direction thereof, two adjacent circuit layers are connected end to end by an LED light source, a first light source electrode and a second light source electrode are respectively arranged on two end surfaces of the LED light source, wherein the first light source electrode is electrically connected to a tail of one of the circuit layers through a first electrode, and the second light source electrode is electrically connected to a head of another adjacent circuit layer through a second electrode, the first light source electrode and the first electrode are electrically connected by a first conductive layer, and the second light source electrode and the second electrode are electrically connected by a second conductive layer; and
    the LED light strip further comprises a protective circuit, the protective circuit being connected in parallel with the at least one LED light source, and when the LED light source is disconnected, the protective circuit is turned on to maintain operation of the soft light board;
    the LED light strip comprises at least two LED light source groups, the LED light source group comprises at least one LED light source, and the protective circuit comprises a voltage stabilizing unit, wherein an A-terminal of the voltage stabilizing unit is respectively connected to a cathode of one LED light source group and an anode of another LED light source group, a B-terminal of the voltage stabilizing unit is connected to an anode of one of the LED light source groups, and a C-terminal is connected to a cathode of another LED light source group;
    the voltage stabilizing unit comprises a first zener diode and a second zener diode connected in series, a cathode of the first zener diode is connected to an anode connection of one LED light source group, an anode of the second zener diode is connected to a cathode of another LED light source group, and an anode of the first zener diode and a cathode of the second zener diode are connected to each other and are also connected to a cathode of the LED light source group and an anode of another LED light source group;
    the LED light strip further comprises a third insulating soft film disposed on an outside of the second insulating soft film, wherein there are two main wire layers between the second insulating soft film and the third insulating soft film, the two main wire layers are respectively electrically connected to a head and a tail of the LED light string, and the two main wire layers and the second insulating soft film as well as the two main wire layers and the third insulating soft film are fixed by insulative glue.

2. The LED light strip according to claim 1, characterized in that the first insulating soft film and the second insulating soft film are both of an elongated structure, and a plurality of circuit layers are provided and spaced at equal distance on the second insulating soft film, two adjacent circuit layers are electrically connected by an LED light source to form LED light strings that are connected in series.

3. The LED light strip of claim 1, characterized in that an opening communicated with the accommodation chamber is opened on a bottom of the flexible protective sleeve, and a transparent baffle is provided at the opening that can block the opening.

4. The LED light strip of claim 1, characterized in that at least one stripe groove extending along a length direction of the flexible protective sleeve is provided on a bottom surface of an inner wall of the accommodation chamber.

* * * * *